United States Patent
Jizaimaru et al.

(10) Patent No.: US 10,654,014 B2
(45) Date of Patent: May 19, 2020

(54) FUNCTIONAL WATER PRODUCING APPARATUS AND FUNCTIONAL WATER PRODUCING METHOD

(71) Applicants: NOMURA MICRO SCIENCE CO., LTD., Atsugi-shi (JP); ACM RESEARCH (SHANGHAI), INC., Shanghai (CN)

(72) Inventors: Takayuki Jizaimaru, Atsugi (JP); David Hui Wang, Shanghai (CN)

(73) Assignees: NOMURA MICRO SCIENCE CO., LTD., Atsugi-shi (JP); ACM RESEARCH (SHANGHAI), INC., Shanghai (CN)

( * ) Notice: Subject to any disclaimer, the term of this patent is extended or adjusted under 35 U.S.C. 154(b) by 148 days.

(21) Appl. No.: 15/417,957

(22) Filed: Jan. 27, 2017

(65) Prior Publication Data

US 2017/0216800 A1 Aug. 3, 2017

(30) Foreign Application Priority Data

Jan. 29, 2016 (JP) ................................. 2016-015142

(51) Int. Cl.
  B01F 15/00 (2006.01)
  B01F 3/04 (2006.01)
  (Continued)

(52) U.S. Cl.
  CPC .... B01F 15/00357 (2013.01); B01F 3/04241 (2013.01); B01F 3/04503 (2013.01);
  (Continued)

(58) Field of Classification Search
  CPC .............. B01F 15/00357; B01F 5/0476; B01F 3/04503; B01F 15/026; B01F 15/0243;
  (Continued)

(56) References Cited

U.S. PATENT DOCUMENTS 767,419 A * 8/1904 Murphy .............. F04B 27/0895
  417/223
3,335,952 A * 8/1967 Yingst .................. B67D 1/1252
  236/92 R
(Continued)

FOREIGN PATENT DOCUMENTS

JP 6-292822 A 10/1994
JP H06292822 * 10/1994
(Continued)

OTHER PUBLICATIONS

EPO translation of Jinzo et al. JPH06292822 published Oct. 21, 1994 (Year: 1994).*

(Continued)

*Primary Examiner* — Stephen Hobson
(74) *Attorney, Agent, or Firm* — Oblon, McClelland, Maier & Neustadt, L.L.P.

(57) ABSTRACT

A functional water producing apparatus in an embodiment includes: a water pressure regulator configured to regulate the water pressure of the ultrapure water, the water pressure regulator having a pressure regulating valve configured to regulate a water pressure of the ultrapure water to an almost constant pressure and a feed water pump configured to pressurize the ultrapure water; a dissolving device configured to dissolve functional gas imparting a specific function in the ultrapure water regulated the water pressure by the water pressure regulator; and a control device configured to control the feed water pump to regulate the water pressure of the functional water to a predetermined constant pressure based on a water pressure or a flow rate of the functional water flowing out of the dissolving device.

6 Claims, 6 Drawing Sheets

US 10,654,014 B2

Page 2

(51) Int. Cl.
 B01F 5/04 (2006.01)
 B01F 15/02 (2006.01)
 C11D 7/04 (2006.01)
 C11D 11/00 (2006.01)

(52) U.S. Cl.
 CPC ...... *B01F 5/0476* (2013.01); *B01F 15/00162* (2013.01); *B01F 15/026* (2013.01); *B01F 15/0243* (2013.01); *C11D 7/04* (2013.01); *C11D 11/0047* (2013.01); *B01F 2003/04404* (2013.01); *B01F 2003/04914* (2013.01); *B01F 2215/004* (2013.01)

(58) Field of Classification Search
 CPC ............ B01F 15/00162; B01F 3/04241; B01F 2215/004; B01F 2003/04914; B01F 2033/04404; B01F 3/04439; B01F 1/0038; B01F 1/0005; C11D 11/0047; C11D 7/04; C02F 2103/04; C02F 1/68
 See application file for complete search history.

(56) References Cited

U.S. PATENT DOCUMENTS

| | | | | |
|---|---|---|---|---|
| 3,370,753 A * | 2/1968 | Yingst | .................. | B67D 1/1277 222/129.1 |
| 3,780,198 A * | 12/1973 | Pahl et al. | ................. | A23L 2/54 426/477 |
| 3,960,066 A * | 6/1976 | LaRocco | .................. | A23L 2/54 99/323.2 |
| 4,140,245 A * | 2/1979 | Castillo | ................ | B67D 1/0009 137/386 |
| 4,859,376 A * | 8/1989 | Hancock | ............. | B01F 3/04241 261/35 |
| 5,553,746 A * | 9/1996 | Jones | .................. | B67D 1/0057 222/129.1 |
| 5,642,761 A * | 7/1997 | Holbrook | .................. | B67C 3/06 141/104 |
| 5,765,726 A * | 6/1998 | Jones | .................... | B67D 1/0021 222/129.1 |
| 5,839,291 A * | 11/1998 | Chang | .................. | B67D 1/0054 62/126 |
| 6,036,053 A * | 3/2000 | Simmons | ............ | B01F 3/04815 222/1 |
| 6,394,311 B2 * | 5/2002 | McCann | .............. | B67D 1/0009 222/129.1 |
| 7,083,071 B1 * | 8/2006 | Crisp, III | ............. | B67D 1/0021 222/129.3 |
| 7,611,031 B2 * | 11/2009 | Crisp, III | ............. | B67D 1/0057 222/129 |
| 2010/0193977 A1 * | 8/2010 | Yamamoto | .......... | B01F 3/04503 261/151 |
| 2012/0325927 A1 | 12/2012 | Tokoshima et al. | | |

FOREIGN PATENT DOCUMENTS

| | | |
|---|---|---|
| JP | 2000-176265 A | 6/2000 |
| JP | 2002-320959 A | 11/2002 |
| JP | 2003-340458 A | 12/2003 |
| JP | 2008-161734 A | 7/2006 |
| JP | 2009-82919 | 4/2009 |
| JP | 2011-88061 | 5/2011 |
| WO | WO 2011/076144 A1 | 6/2011 |

OTHER PUBLICATIONS

"Volute (pump)" Wikipedia published May 26, 2009 accessed at <https://en.wikipedia.org/w/index.php?title=Volute_(pump)&oldid=292405353> (Year: 2009).*
Office Action dated Jun. 13, 2017 in Japanese Patent Application No. 2016-015142.
Office Action dated Jan. 31, 2020, in Korean Patent Application No. 2017-0009919, filed Jan. 20, 2017 w/English translation.

* cited by examiner

FUNCTIONAL WATER PRODUCING APPARATUS AND FUNCTIONAL WATER PRODUCING METHOD

CROSS REFERENCE TO RELATED APPLICATIONS

This application is based upon and claims the benefit of priority from Japanese Patent Application No. 2016-015142, filed on Jan. 29, 2016; the entire contents of which are incorporated herein by reference.

FIELD

Embodiments described herein relate generally to a functional water producing apparatus and a functional water producing method.

BACKGROUND

In recent years, the practicability of a so-called functional water made by dissolving specific gas in ultrapure water, in a use of washing electronic material has been recognized, and it becomes popular, for example, in a wet cleaning process. An apparatus having a gas permeable membrane module to dissolving gas in the ultrapure water is usually used as a gas dissolving device.

It is known that about the gas dissolving device, regarding gas such as hydrogen, functional water in which gas is dissolved with an intended concentration can be accurately obtained by supplying ultrapure water at a fixed flow rate with respect to a unit flow rate of gas to be dissolved. Therefore, a gas dissolving device is proposed which is configured such that the supply flow rate of the ultrapure water and the supply flow rate of the gas to the dissolving device are controlled to stably keep the concentration of the gas in the functional water.

Here, the ultrapure water in which the gas is dissolved is generally produced in an ultrapure water producing apparatus having a primary pure water system and a secondary pure water system. The primary pure water system produces primary pure water by removing impurities such as ionic substances and nonionic substances from raw water. The primary pure water is stored once in a primary pure water tank, and is introduced from the primary pure water tank into the secondary pure water system. The secondary pure water system treats the primary pure water to produce ultrapure water. As needed, an ultrapure water tank that stores the ultrapure water is placed at the final stage of the ultrapure water producing apparatus. The ultrapure water is stored, for example, in the ultrapure water tank, and then supplied to a point of use of the ultrapure water (POU). The ultrapure water tank and the primary pure water tank are connected by a reflux pipe. The reflux pipe refluxes the ultrapure water from the ultrapure water tank to the primary pure water tank. The point of use of the ultrapure water is connected, for example, to the route of the reflux pipe.

The gas dissolving device is generally connected to the point of use of the ultrapure water. The gas dissolving device dissolves gas in the ultrapure water supplied from the ultrapure water producing apparatus to produce functional water. The produced functional water is directly supplied to the point of use of the functional water. The point of use of the functional water is a washing apparatus for a silicon wafer or the like.

Here, the reflux pipe connected to the ultrapure water producing apparatus sometimes connects to a plurality of points of use. In such a case, the water pressure of the ultrapure water produced by the ultrapure water producing apparatus is usually kept almost constant, and therefore the supply pressure of the ultrapure water supplied to each of the points of use of the ultrapure water, is also kept almost constant.

However, the amounts of the ultrapure water used at the plurality of points of use of the ultrapure water may independently fluctuate. In this case, depending on the timing of fluctuation, the supply pressure of the ultrapure water at a certain point of use of the ultrapure water fluctuates. For example, in the case where the plurality of points of use of the ultrapure water are a plurality of the above-described washing apparatuses, when the timings of stop of washing cycles of some of the plurality of washing apparatuses are overlapped, the supply pressure of the ultrapure water in a not-stopped apparatus sometimes greatly increases. Besides, when the number of points of use of the ultrapure water is large, the point of use of the ultrapure water placed closer to the downstream of the reflux pipe is likely to be affected by the change in the amount of the ultrapure water used on the upstream side, and there are concerns about unexpected decreases in supply flow rate and supply pressure of the ultrapure water.

Incidentally, a silicon wafer increasingly becomes large in size. The large-sized silicon wafer is washed by a pouring washing method of washing the silicon wafer by pouring the functional water thereon. In the washing apparatus which wash the silicon wafer by the pouring washing method, generally, the washing is controlled by the washing time, and therefore when the supply pressure of the functional water to the washing apparatus decreases, the supply amount of the functional water to the silicon wafer surface becomes insufficient, and washing cannot be sufficient in some cases.

The problem of insufficient washing due to the insufficiency in the supply amount of the functional water onto the silicon wafer surface becomes more conspicuous in a larger semiconductor wafer. Specifically, the above problem of insufficient washing becomes more conspicuous, for example, when the silicon wafer is as large as 200 mm diameter or more. Therefore, it has been required in the washing of such a large-sized silicon wafer that the supply pressure of the functional water is more stably kept constant.

SUMMARY

Figure 1:
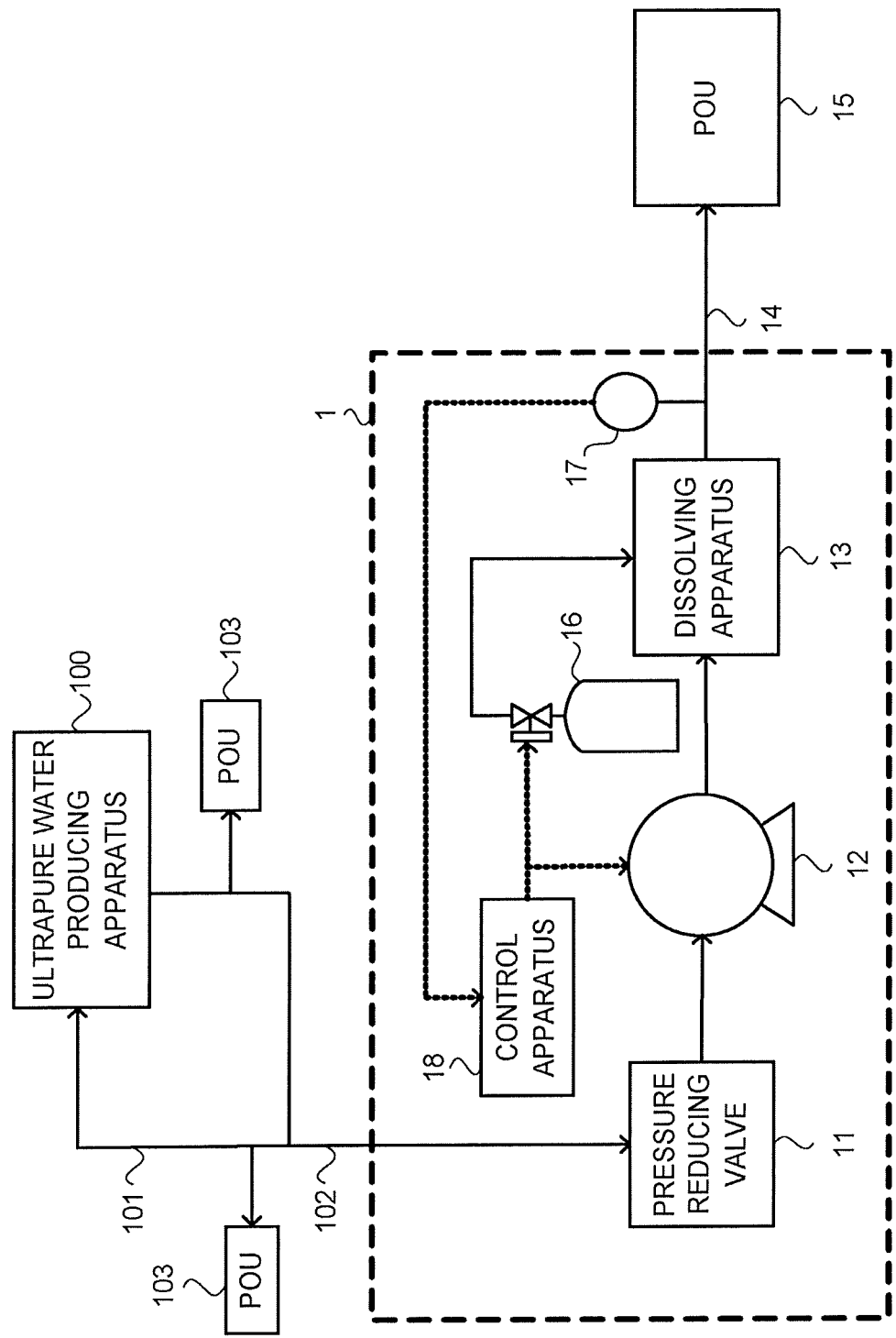
FIG. 1 is a block diagram schematically illustrating a functional water producing apparatus in an embodiment.

The present invention has been made to solve the above-described problem, and its object is to provide a functional water producing apparatus and a functional water producing method capable of stably keeping a supply pressure of functional water.

A functional water producing apparatus in an embodiment includes: a water pressure regulator configured to regulate the water pressure of the ultrapure water, the water pressure regulator having a pressure regulating valve configured to regulate a water pressure of the ultrapure water to an almost constant pressure and a feed water pump configured to pressurize the ultrapure water; and a dissolving device configured to dissolve functional gas imparting a specific function in the ultrapure water regulated the water pressure by the water pressure regulator. The functional water producing apparatus in an embodiment preferably further includes a control device configured to control the feed water pump to regulate the water pressure of the functional water to a predetermined constant pressure based on a water pressure or a flow rate of the functional water flowing out of the dissolving device.

In the functional water producing apparatus in an embodiment it is preferable that the water pressure regulator includes: the pressure regulating valve; and the feed water pump configured to pressurize the ultrapure water regulated the water pressure by the pressure regulating valve. In the functional water producing apparatus in an embodiment it is preferable that the water pressure regulator includes: the feed water pump; and the pressure regulating valve configured to regulate a water pressure of the ultrapure water pressurized by the feed water pump to an almost constant pressure.

In the functional water producing apparatus in an embodiment, it is preferable that the water pressure of the ultrapure water flowing out of the pressure regulating valve is lower by 20 kPa to 200 kPa than the water pressure of the ultrapure water supplied to the pressure regulating valve. Further, it is preferable that a feed water pressure of the ultrapure water supplied to the dissolving apparatus is 235 kPa to 265 kPa.

The functional water producing apparatus in an embodiment preferably further includes: a water pressure sensor configured to measure the water pressure of the functional water flowing out of the dissolving device and output a measured value, wherein the control device controls the feed water pump based on the measured value so that the water pressure of the functional water is kept at the predetermined constant pressure.

In the functional water producing apparatus in an embodiment, it is preferable that the functional gas is hydrogen gas.

A functional water producing method in an embodiment includes: a pressure regulation and pressurization step having a pressure regulation step of regulating a water pressure of ultrapure water to an almost constant pressure with a pressure regulating valve and a pressurization step of pressurizing the ultrapure water with a feed water pump; and a dissolution step of dissolving functional gas imparting a specific function in the regulated ultrapure water at the pressure regulation and pressurization step. The functional water producing method in an embodiment preferably further includes a control step of controlling the feed water pump based on a water pressure or a flow rate of the functional water flowing out of the dissolving device so that the water pressure of the functional water is kept at a predetermined constant pressure.

In the functional water producing method in an embodiment it is preferable that the pressure regulation and pressurization step includes: the pressure regulation step of regulating a water pressure of ultrapure water to an almost constant pressure; and the pressurization step of pressurizing the ultrapure water regulated the water pressure at the pressure regulation step. In the functional water producing method in an embodiment it is preferable that the pressure regulation and pressurization step includes: the pressurization step of pressurizing ultrapure water; and the pressure regulation step of regulating a water pressure of the ultrapure water pressurized at the pressurization step, to an almost constant pressure.

The functional water producing method in an embodiment preferably further includes: a water pressure measurement step of measuring the water pressure of the functional water flowing out of the dissolving device, wherein at the control step, the feed water pump is controlled based on the water pressure of the functional water measured at the water pressure measurement step so that the water pressure of the functional water is kept at a predetermined water pressure.

By a functional water producing apparatus and a functional water producing method in embodiments, the supply pressure of the functional water can be stably kept.

DETAILED DESCRIPTION

In the conventional dissolving device, the problem of insufficient washing due to the insufficient amount of the washing functional water supplied onto the silicon wafer surface as described above is not resolved. The present inventors supposed that this insufficiency was because any particular attention was not paid to prevent supply pressure of the functional water from fluctuating in the conventional dissolving device configured to keep the concentration of gas in the functional water. In other words, the conventional dissolving device is configured on the premise that the supply pressure of the ultrapure water to the dissolving device is constant, and therefore when the supply pressure of the ultrapure water fluctuates, the supply pressure of the functional water to be produced is not kept constant.

First Embodiment

Hereinafter, embodiments will be described in detail referring to the drawings. FIG. 1 is a block diagram schematically illustrating a functional water producing apparatus 1 in a first embodiment. The functional water producing apparatus 1 solves the above-described problem by, even when supply pressure of ultrapure water fluctuates, buffering the fluctuation to prevent supply pressure of functional water from fluctuating. As in FIG. 1, the functional water producing apparatus 1 is connected to an ultrapure water producing apparatus 100 that produces the ultrapure water and supplies the ultrapure water to the functional water producing apparatus 1, via a circulation pipe 101 that circulates the ultrapure water produced in the ultrapure water producing apparatus 100. A plurality of points of use 103 are places where the ultrapure water is used the points of use 103 are connected to a route of the circulation pipe 101. An ultrapure water supply pipe 102 is connected to the circulation pipe 101. The functional water producing apparatus 1 is connected to the circulation pipe 101 via the ultrapure water supply pipe 102.

The ultrapure water producing apparatus 100 is an apparatus that produces ultrapure water by removing ionic substances, organic substances, dissolved gas, fine particles and the like from raw water such as tap water, well water, river water, industrial water or the like. The ultrapure water producing apparatus 100 generally includes a pre-treatment system that removes turbid matter in the raw water, and a primary pure water system that produces primary pure water by removing ionic substances and nonionic substances from raw water pre-treated (pre-treated water). The primary pure water system includes, for example, a reverse osmosis membrane apparatus, an ion exchange apparatus, a degassing apparatus, an ultraviolet oxidation apparatus and so on. The ultrapure water producing apparatus 100 may further include a primary pure water tank that temporarily stores the primary pure water, and a secondary pure water system on the downstream of the primary pure water tank. The secondary pure water system removes a minute amount of impurities remaining in the primary pure water. Part of the produced ultrapure water may be circulated back to the primary pure water tank via the circulation pipe 101.

The resistivity of the ultrapure water produced in the ultrapure water producing apparatus 100 is preferably 10 MΩ·cm or more and more preferably 18 MΩ·cm or more.

The producing amount of the ultrapure water in the ultrapure water producing apparatus 100 is representatively 100 t/hour to 1000 t/hour. To the route of the circulation pipe 101, the plurality of points of use of the ultrapure water (POU) 103 are connected. The produced ultrapure water is used in parallel at the points of use of the ultrapure water 103. The number of points of use of the ultrapure water 103 connected to the ultrapure water producing apparatus 100 producing the ultrapure water in the above-described producing amount is, for example, a hundred to several hundreds though only two points are illustrated in FIG. 1. In this case, the amount of the ultrapure water used at one point of use of the ultrapure water 103 is generally, for example, 1 t/hour to 2 t/hour for washing the silicon wafer. Further, in such a case, the supply pressure of the ultrapure water from the ultrapure water producing apparatus 100 to each point of use of the ultrapure water 103 and to the ultrapure water supply pipe 102 is about 250 kPa to 300 kPa at the normal times (at the time in a stable state without fluctuation). In this manner, part of the ultrapure water produced in the ultrapure water producing apparatus 100 is introduced into the functional water producing apparatus 1 via the circulation pipe 101 and the ultrapure water supply pipe 102.

The functional water producing apparatus 1 illustrated in FIG. 1 includes a pressure reducing valve 11 as a pressure regulating valve, a feed water pump 12, and a dissolving device 13. The functional water producing apparatus 1 further includes a functional gas supply apparatus 16, a water pressure sensor 17, and a control device 18. A functional water supply pipe 14 is connected to the dissolving device 13. The functional water supply pipe 14 supplies functional water produced in the dissolving device 13 to a point of use of the functional water 15 of its' supply destination. The point of use of the functional water 15 is, for example, a washing apparatus, a surface treatment apparatus or the like for electronic material.

The pressure reducing valve 11 regulates the water pressure of the ultrapure water supplied thereto via the ultrapure water supply pipe 102. More specifically, the pressure reducing valve 11 decreases the water pressure of the ultrapure water to an almost constant water pressure. When the water pressure of the ultrapure water temporarily fluctuates to increase or decrease from that at the normal times, the pressure reducing valve 11 buffers the fluctuation so that the ultrapure water flows out at the almost constant pressure from the pressure reducing valve 11.

The pressure reducing valve 11 is not particularly limited as long as it regulates the water pressure of feed water and then supplies it to the downstream. The pressure reducing valve 11 is, for example, a pressure reducing valve which includes a diaphragm and a spring, and has a pressure reducing mechanism that reduces the water pressure by the diaphragm. In the pressure reducing valve, water flows from a water flow inlet port to a water flow outlet port through the pressure reducing mechanism. In this event, by the pressure fluctuation at the water flow outlet port, the diaphragm is displaced. The displacement of the diaphragm operates the pressure reducing mechanism to reduce the water pressure from the water flow inlet port to the water flow outlet port. As described above, the pressure reducing valve 11 reduce the water pressure of the feed water and then supplies it to the downstream. The water pressure of the ultrapure water flowing out by the pressure reducing valve 11 can be adjusted, for example, by the strength of the spring provided at the pressure reducing mechanism.

The outflow pressure (water pressure on the secondary side) of the ultrapure water from the pressure reducing valve 11 is, for example, when the supply pressure of the ultrapure water from the ultrapure water supply pipe 102 (on the primary side) is 250 kPa to 300 kPa at the normal times, preferably in a range of 100 kPa to a pressure lower by 20 kPa than the pressure of the ultrapure water supplied from the ultrapure water producing apparatus 100, and more preferably the pressure of the ultrapure water in a range of 150 kPa to 200 kPa. Therefore, the water pressure of the secondary side of the pressure reducing valve 11 is decreased from that of the primary side preferably by a range of 20 kPa to 200 kPa, and more preferably about 40 kPa to 150 kPa. This ensures that the pressure reducing valve 11 can keep the outflow pressure of the ultrapure water almost constant in a range of ±5% from the above-described preferable value. Note that when the difference between the supply pressure of the ultrapure water on the primary side and the target value of the outflow pressure from the pressure reducing valve 11 is small, the pressure reduction amount in the pressure reducing valve 11 may be smaller than the above.

The differential pressure between the primary side and the secondary side of the pressure reducing valve 11 is preferably a value in a range of 45% to 55% of the maximum pressurization amount (maximum discharge head) of the feed water pump 12, and more preferably a value in a range of 50% to 55%. When the differential pressure is 45% or more of the maximum pressurization amount of the feed water pump 12, the water pressure of the ultrapure water is sufficiently reduced in the pressure reducing valve 11. As a result, the discharge pressure of the feed water pump 12 becomes more stable. When the differential pressure is 55% or less of the maximum pressurization amount of the feed water pump 12, the ultrapure water is sufficiently pressurized in the feed water pump 12, and therefore the water pressure of the functional water becomes more stable.

The feed water pump 12 pressurizes the ultrapure water whose pressure decreased by the pressure reducing valve 11 to a predetermined water pressure. The feed water pump 12 is not particularly limited as long as it is controllable in pressurization amount. The feed water pump 12 enable to pressurize the ultrapure water at a maximum by preferably 250 kPa or more from the viewpoint of keeping sufficient concentration of the functional water.

The feed water pump 12 is, for example, a rotary positive displacement pump that successively sucks and discharges liquid by change in volume, a reciprocating positive displacement pump that repeatedly sucks and discharges liquid by change in volume, a centrifugal pump that discharges liquid by the centrifugal force or propulsive force generated by rotation of an impeller or propeller in the pump or the like.

More specifically, the rotary positive displacement pump is a tube pump, a rotary pump, a gear pump, a snake pump or the like. The reciprocating positive displacement pump is a diaphragm pump, a plunger pump or the like. Besides, the centrifugal pump is a volute pump or the like. The feed water pump 12 is preferably the rotary positive displacement pump or the centrifugal pump among them, in the point that it causes less pulsation of fluid and keeps the discharge pressure almost constant, and is particularly preferably the volute pump being the centrifugal pump.

The water pressure of the ultrapure water flowing out of the feed water pump 12 is, for example, when the supply pressure of the ultrapure water from the ultrapure water supply pipe 102 at the normal times is 250 kPa to 300 kPa, preferably in a range of 235 kPa to 265 kPa. The outflow pressure of the ultrapure water from the feed water pump 12 falling in the above-described range makes it possible to generate the functional water with a stable concentration.

The pressurization amount in the feed water pump 12 is preferably in a range of 30 kPa to 300 kPa, and more preferably in a range of 50 kPa to 260 kPa though depending on the pressure reduction amount in the pressure reducing valve 11. The pressurization amount being 30 kPa or more keeps more stably the sufficient concentration of the functional water. The pressurization amount being 300 kPa or less facilitates precise feedback control of the discharge pressure of the feed water pump 12.

The water pressure sensor 17 measures the water pressure of the functional water in the functional water supply pipe 14 and outputs a water pressure detection signal. The water pressure sensor 17 is, for example, a standard diaphragm gauge water pressure sensor. A commercial item of the water pressure sensor 17 is, for example, a pressure gauge manufactured by Surpass Industry Co., Ltd or the like. The water pressure sensor 17 outputs a water pressure detection signal, and the output signal is inputted into the control device 18.

The control device 18 controls the pressurization amount of the feed water pump 12 on the basis of the output (measured value) of the water pressure sensor 17 so that the discharge pressure of the feed water pump 12 becomes a predetermine constant pressure. More specifically, when the centrifugal pump such as the volute pump is used as the feed water pump 12, the control device 18 feeds back the water pressure detection signal from the water pressure sensor 17, compares it with the target water pressure value, and controls the operation frequency of the feed water pump 12 so that the deviation of the detected water pressure value from the target water pressure value becomes zero.

The dissolving device 13 is, for example, an apparatus that injects and dissolves the functional gas in the ultrapure water via a gas permeable membrane, or an apparatus that dissolves the functional gas by directly bubbling the functional gas in the ultrapure water flowing through the pipe. Further, the dissolving device 13 may be an apparatus that injects the functional gas in the ultrapure water and then dissolves the functional gas by a dispersion means such as a static mixer. Further, the dissolving device 13 may be an apparatus that supplies the ultrapure water into a gas dissolver by a pump, supplies the functional gas into the ultrapure water on the upstream side from the pump, and dissolves the functional gas by agitation in the pump.

The functional gas supply apparatus 16 includes, for example, a massflow controller that adjusts the supply flow rate of the functional gas in a functional gas storage apparatus that generates and stores the functional gas.

In this case, the control device 18 controls the supply flow rate of the functional gas from the functional gas supply apparatus 16 to the dissolving device 13. For example, based on the measured value of the water pressure sensor 17, the control device 18 controls the supply flow rate of the functional gas by the massflow controller provided in the functional gas supply apparatus 16. Thus, the functional gas is supplied from the functional gas supply apparatus 16 to the dissolving device 13 so that the functional water with a desired concentration is produced.

The functional gas is, for example, hydrogen gas, oxygen gas, nitrogen gas, ozone gas, carbon dioxide gas or the like. By the functional water in which hydrogen gas, oxygen gas or the like as the functional gas is dissolved, the fine particles on the surface of the electronic material can be removed. By the functional water in which ozone gas as the functional gas is dissolved, organic substances and metal components on the surface of the electronic material can be removed. By the functional water in which carbon dioxide gas as the functional gas is dissolved, the occurrence of static electricity on the surface of a washed article can be prevented. The functional gas is preferably hydrogen gas from the point of removing the fine particles on the surface of the electronic material.

For example, when the functional gas is hydrogen gas, the functional water thus generated in the dissolving device 13 preferably has a dissolved hydrogen concentration at 25° C. under 1 atm of 0.1 mg/L or more, more preferably 0.5 mg/L to 1.5 mg/L, and furthermore preferably 1.0 mg/L to 1.2 mg/L. The flow rate of the generated functional water is, for example, 0.5 L/min to 2 L/min per a silicon wafer in the use of washing the semiconductor wafer.

Figure 2:
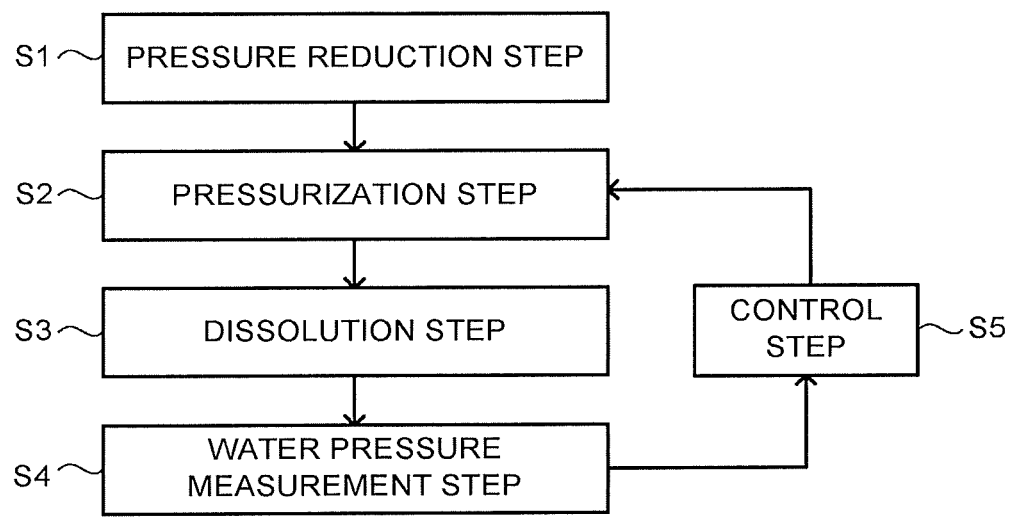
FIG. 2 is a flowchart schematically illustrating an example of a functional water producing method using the functional water producing apparatus in the embodiment.

Subsequently, the operation of the functional water producing apparatus 1 and the functional water producing method will be described referring to FIG. 2. FIG. 2 is a flowchart schematically illustrating an example of the functional water producing method using the functional water producing apparatus 1. The functional water producing method illustrated in FIG. 2 has a pressure reduction step S1, a pressurization step S2, a dissolution step S3, a water pressure measurement step S4, and a control step S5. When the ultrapure water is supplied from the ultrapure water supply pipe 102, the pressure reducing valve 11 regulates the water pressure of the ultrapure water supplied thereto to reduce the water pressure to almost constant (S1). After the pressure reducing valve 11 reduces the water pressure of the ultrapure water to almost constant, the feed water pump 12 then pressurizes the ultrapure water reduced in pressure to a predetermined pressure (S2). Here, the functional gas supply apparatus 16 supplies the functional gas to the dissolving device 13. The dissolving device 13 dissolves the functional gas supplied from the functional gas supply apparatus 16 in the ultrapure water pressurized by the feed water pump (S3). The water pressure sensor 17 measures the water pressure of the ultrapure water (functional water) in which the functional gas is dissolved by the dissolving device 13 (S4). The control device 18 controls the pressurization amount of the feed water pump 12 so that the discharge pressure of the feed water pump 12 becomes a predetermined constant pressure, based on the output (measured value) of the water pressure sensor 17 or the flow rate of the functional water (S5).

Figure 3:
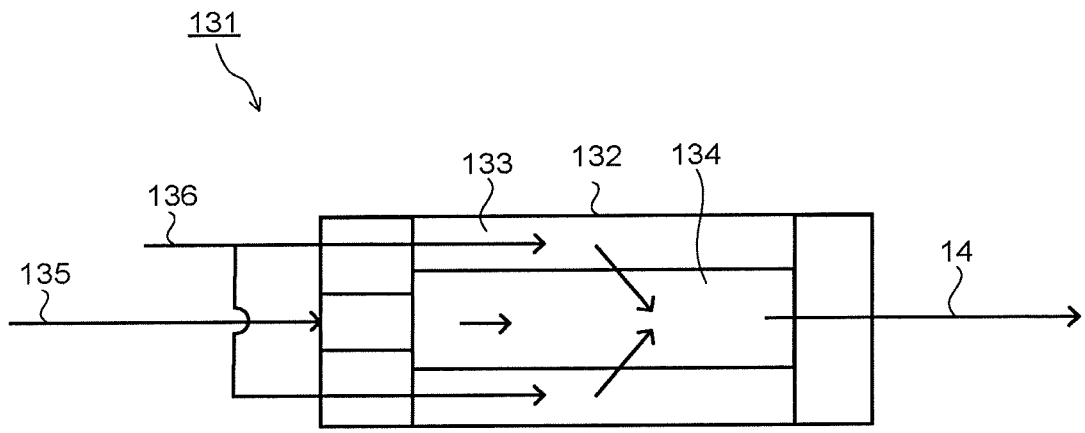
FIG. 3 is a cross-sectional diagram schematically illustrating a dissolving device used in the functional water producing apparatus in the embodiment.

Subsequently, an example of the dissolving device 13 will be described referring to FIG. 3. FIG. 3 schematically illustrates, as one example of the dissolving device 13, a dissolving device 131 that injects and dissolves the functional gas in the ultrapure water via the gas permeable membrane. The dissolving device 131 is an apparatus that includes a hollow fiber membrane as the gas permeable membrane and dissolves the functional gas in the ultrapure water via the hollow fiber membrane. The dissolving device 131 includes a hollow fiber membrane dissolver 132 (hollow fiber membrane unit) in which the hollow fiber membrane is installed. To the inside of the hollow fiber membrane dissolver 132, a water-to-be-treated supply pipe 136 is connected which supplies the ultrapure water to the hollow fiber membrane dissolver 132. The ultrapure water is supplied to an outside 133 of the hollow fiber membrane through the water-to-be-treated supply pipe 136. Meanwhile, the functional gas passes through a gas supply pipe 135 connected to the hollow fiber membrane dissolver 132, and is supplied to an inside 134 of the hollow fiber membrane, at a pressure lower than an outside supply pressure. Thus, the ultrapure water on the outside permeates the hollow fiber membrane and dissolves the functional gas, whereby the functional water is prepared.

The functional water supply pipe 14 is connected to a water outflow port of the hollow fiber membrane dissolver 132, and the prepared functional water is discharged to the outside of the hollow fiber membrane dissolver 132 via the functional water supply pipe 14. In the dissolving device 131, the ultrapure water flowing into the hollow fiber membrane dissolver and the supplied functional gas stay for a fixed time at a liquid phase and a gas phase of the hollow fiber membrane dissolver respectively. In this event, the liquid phase and the gas phase exhibit buffer functions with respect to fluctuation in supply amount of the functional gas and to slight temporal delay. Therefore, by the dissolving device 131, it is possible to stably produce the functional water with less fluctuation in concentration of the dissolved functional gas.

Further, the functional water producing apparatus 1 preferably includes a degassing apparatus between the dissolving device 13 and the feed water pump 12. This is because the degassing apparatus removes in advance dissolved gas other than the functional gas, such as dissolved oxygen, dissolved nitrogen and so on in the ultrapure water supplied to the dissolving device 13, so as to increase the solubility of the functional gas into the ultrapure water in the dissolving device 13. In this case, the degassing apparatus preferably decreases, for example, the dissolved oxygen concentration in the ultrapure water supplied to the dissolving device 13, to about 0.1 mg/L or less. The degassing apparatus is preferably a vacuum degassing apparatus with a gas permeable membrane or the like.

The functional water with a predetermined concentration obtained as described above in the functional water producing apparatus 1 in this embodiment is supplied via the functional water supply pipe 14 to the point of use of the functional water 15 and used there. The functional water producing apparatus 1 can supply the functional water to the point of use of the functional water at a constant supply pressure even when the supply pressure of the ultrapure water from the ultrapure water producing apparatus 100 fluctuates.

Here, the mechanism of keeping the supply pressure of the functional water constant by the functional water producing apparatus 1 will be described. Generally, in the feedback control of the feed water pump to add pressure to the ultrapure water, the rotation frequency of the motor of the feed water pump is controlled only after fluctuation occurs on the secondary side, and therefore irregularity (overshoot) in control value due to time lag is likely to occur. Especially when the water pressure fluctuation on the primary side is large, the irregularity in control value is amplified, and therefore it takes time to stabilize the control value to the target value.

In the functional water producing apparatus in the embodiment, the pressure reducing valve 11 is disposed directly before the feed water pump 12 to thereby keep the water pressure on the primary side of the feed water pump 12 almost constant water pressure as described above. As a result, the water pressure fluctuation on the secondary side is decreased, so that the irregularity in control value in the feedback control of the feed water pump 12 becomes extremely small. As a result, the supply water pressure of the ultrapure water to the dissolving device 13 can be kept almost constant.

Further, in the functional water producing apparatus 1 in the embodiment, use of the measured value of the water pressure of the functional water by the water pressure sensor 17 is also beneficial in the feedback control. Generally, the water pressure sensor 17 is short in measurement time and high in measurement accuracy as compared with the flow rate sensor, and is therefore excellent in responsiveness. Therefore, the control value is less affected by the time lag from the water pressure measurement by the water pressure sensor 17 to the motor control of the feed water pump 12 and by the measurement error by the water pressure sensor 17. As described above, through use of the measured value of the water pressure of the functional water by the water pressure sensor 17, the discharge pressure of the feed water pump 12 is precisely controlled.

As described above, the functional water producing apparatus in this embodiment as the pressure reducing valve disposed directly before the feed water pump, so that the discharge pressure of the feed water pump can be stabilized. Therefore, the supply water pressure of the functional water to the point of use can be stably kept. Further, since the supply water pressure of the ultrapure water and the supply flow rate of the functional gas to the dissolving device 13 are controlled based on the water pressure of the functional water, the functional water can be supplied to the point of use more stable in pressure as compared with control by flow rate.

Second Embodiment

Figure 4:
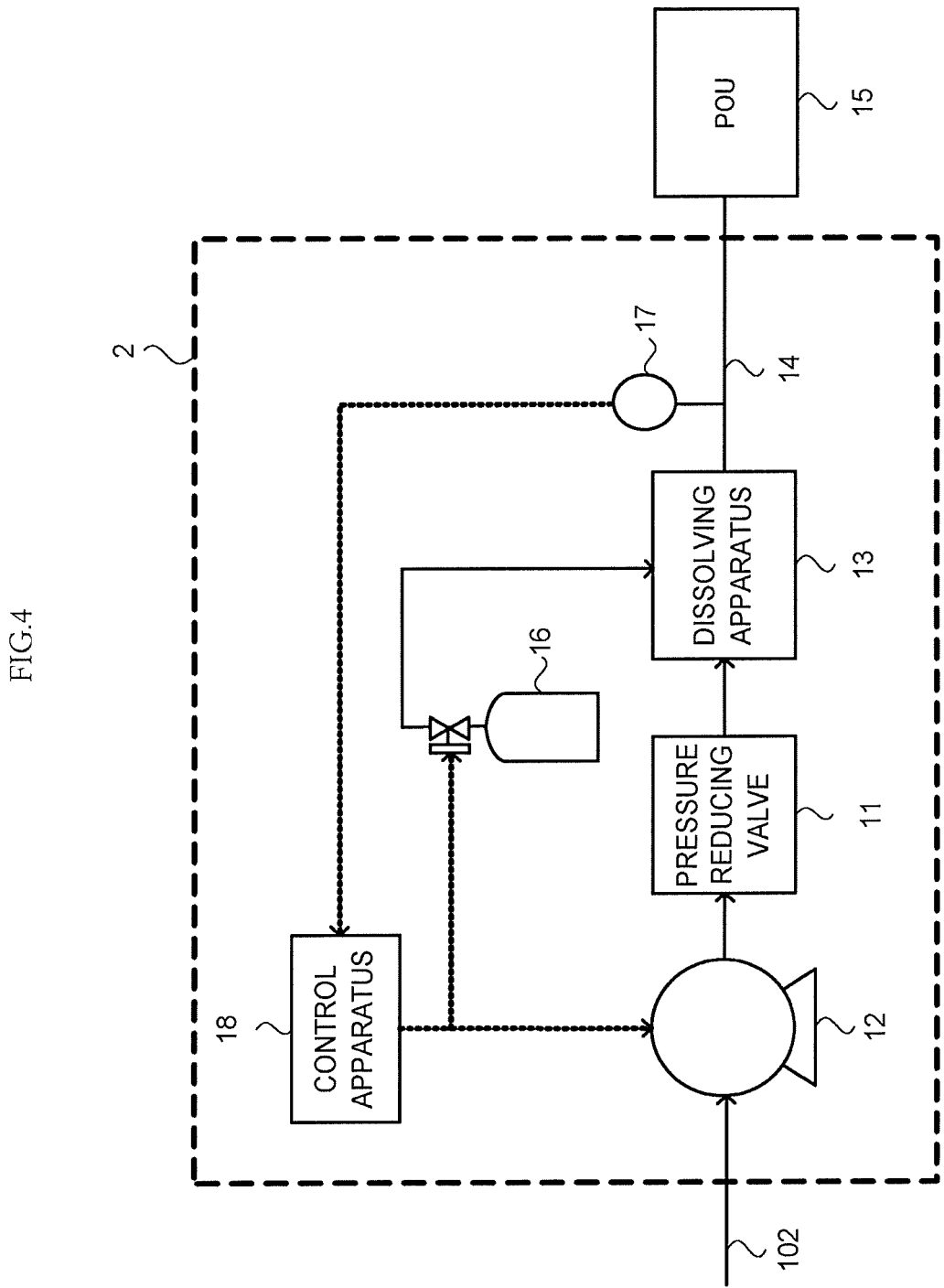
FIG. 4 is a block diagram schematically illustrating a functional water producing apparatus in another embodiment.

Next, a functional water producing apparatus 2 in a second embodiment will be described. FIG. 4 is a block diagram schematically illustrating a functional water producing apparatus 2. The functional water producing apparatus 2 illustrated in FIG. 4 has the same configurations as that of the functional water producing apparatus 1 illustrated in FIG. 1 except that the arrangement of the pressure reducing valve 11 and the feed water pump 12 is reversed from that of the functional water producing apparatus 1. Therefore, the same numerals are given to the configurations performing the same functions as those in FIG. 1 and redundant description will be omitted.

In the functional water producing apparatus 2, the feed water pump 12 pressurizes the ultrapure water supplied from the ultrapure water producing apparatus to a predetermined water pressure. For example, when the ultrapure water is supplied at a pressure by 250 kPa to 300 kPa at the normal times, the feed water pump 12 pressurizes the ultrapure water from higher by 30 kPa than the supply pressure to 350 kPa. The feed water pump 12 is set to add pressure preferably by 30 kPa to 200 kPa though depending on the pressure reduction amount in the pressure reducing valve 11 on the downstream.

Then, the pressure reducing valve 11 reduces the pressure of the ultrapure water pressurized in the feed water pump 12. The pressure reducing valve 11 reduces the pressure of the ultrapure water preferably by in a range of 235 kPa to 265 kPa, and more preferably about 250 kPa. Thus, the pressure of the ultrapure water flowing out of the pressure reducing valve 11 is kept almost constant in a range of ±5% from the above-described preferable value. Therefore, the pressure reducing valve 11 reduces the pressure (on the secondary side) of the ultrapure water supplied by the feed water pump 12 preferably by a range of 20 kPa to 200 kPa, and more preferably about 40 kPa to 150 kPa. Note that when the target value of the pressurization amount in the feed water pump 12 is small, the pressure reduction amount in the pressure reducing valve 11 may be small in this embodiment.

The differential pressure between the primary side and the secondary side of the pressure reducing valve 11 is preferably a value in a range of 45% to 55% of the maximum pressurization amount (maximum discharge head) of the feed water pump 12, and more preferably a value in a range of 50% to 55%. When the differential pressure is 45% or more of the maximum pressurization amount of the feed water pump 12, the water pressure is sufficiently reduced, so that the discharge pressure of the feed water pump 12 becomes more stable. When the differential pressure is 55% or less of the maximum pressurization amount of the feed water pump 12, the ultrapure water is sufficiently pressurized in the feed water pump 12, and therefore the water pressure of the functional water becomes more stable.

As described above, the functional water producing apparatus 2 in this embodiment has the pressure reducing valve disposed directly after the feed water pump, so that the supply water pressure of the ultrapure water to the dissolving device is stabilized. Therefore, the supply water pressure of the functional water to the point of use can be stably kept. Further, since the supply water pressure of the ultrapure water and the supply flow rate of the functional gas to the dissolving device 13 are controlled based on the water pressure of the functional water, the supply pressure of the functional water to the point of use can be controlled stably as compared with the case of performing flow rate control. In particular, the functional water producing apparatus 2 is suitable for the case where the supply pressure of the ultrapure water from the ultrapure water producing apparatus 100 is lower than a desired water pressure.

EXAMPLE

Example 1

In the configuration in FIG. 1, a pressure reducing valve (manufactured by Sekisui Chemical Co., Ltd., TYPE 755) and a feed water pump (manufactured by Levitronix GmbH, BPS-600) were used in this order to supply ultrapure water into a dissolving device (a hollow fiber membrane dissolving device, model number G284, manufactured by Membrana GmbH) at a flow rate of 20 L/min. This dissolving device was used to dissolve hydrogen gas in the ultrapure water to produce hydrogen water. In this event, the supply flow rate of the hydrogen gas to the dissolving device was set so that the hydrogen concentration in the hydrogen water to be produced became 1.2 mg/L. The supply flow rate of the hydrogen gas was 290 mL/min. The outflow pressure of the ultrapure water of the pressure reducing valve was set to 0.2 MPa. Further, the water pressure of the hydrogen water was measured by a water pressure sensor (a pressure gauge manufactured by Surpass Industry Co., Ltd), and the discharge pressure of the feed water pump was feedback-controlled with the measured value of the water pressure sensor so that the discharge pressure of the feed water pump became 0.25 MPa. The supply pressure of the ultrapure water to the pressure reducing valve was set to almost constant at 0.24 MPa, and temporarily decreased and then increased, and the water pressure of the ultrapure water on the outlet port of the pressure reducing valve (=the water pressure of the ultrapure water on the inlet port of the feed water pump) and the water pressure fluctuation of the hydrogen water flowing out of the dissolving device were investigated. The results are depicted in FIG. 5.

Figure 5:
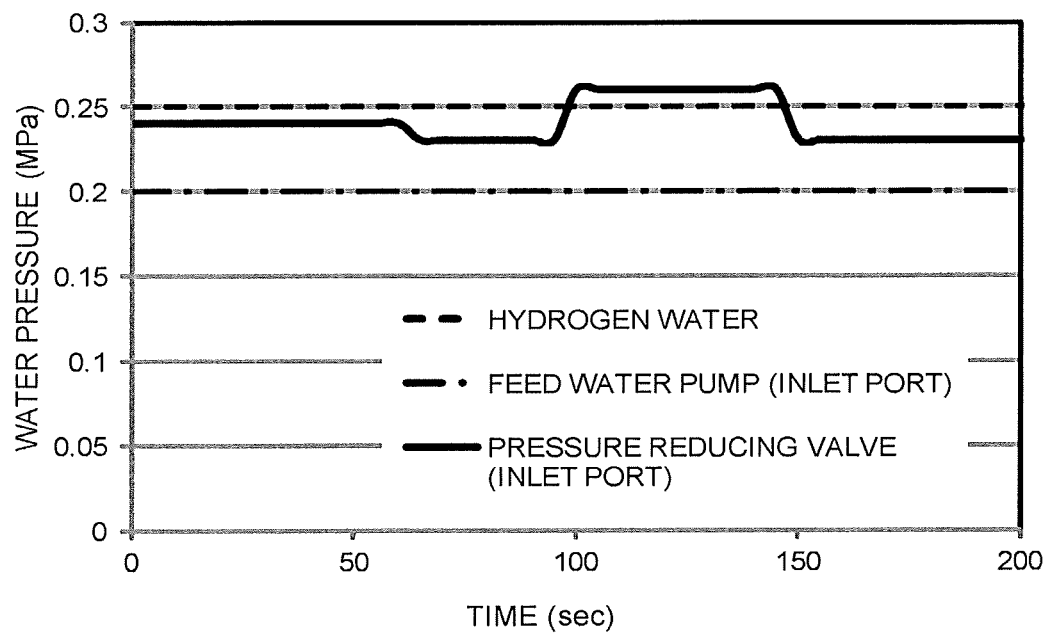
FIG. 5 is a graph depicting a water pressure fluctuation of hydrogen water flowing out of a dissolving device in an example.

As depicted in FIG. 5, it is found that by the configuration in FIG. 1 in which the pressure reducing valve was disposed at the previous stage to the feed water pump, the water pressure of the hydrogen water was stably kept even when the supply water pressure to the pressure reducing valve fluctuates.

Comparative Example 1

By the same configuration as the one made by omitting the pressure reducing valve 11 from the configuration in FIG. 1, the ultrapure water was fed to the dissolving device similarly to Example 1 except that the pressure reducing valve was not used but only the feed water pump was used. In this event, the discharge pressure of the feed water pump was feedback-controlled with the measured value of the water pressure sensor so that the discharge pressure of the feed water pump became 0.25 MPa. The supply pressure of the ultrapure water to the feed water pump was set to almost constant at 0.2 MPa and temporarily decreased therefrom for about 5 seconds, and the fluctuation in water pressure of the hydrogen water in this event was investigated. The result is depicted in FIG. 6.

Comparative Example 2

By the same configuration as the one made by omitting the pressure reducing valve 11 from the configuration in FIG. 1, the ultrapure water was fed to the dissolving device similarly to Example 1 except that the pressure reducing valve was not used but only the feed water pump was used. In this event, the discharge pressure of the feed water pump was feedback-controlled with the measured value of the water pressure sensor so that the discharge pressure of the feed water pump became 0.25 MPa. The supply pressure of the ultrapure water to the feed water pump was set to almost constant at 0.2 MPa and temporarily decreased therefrom for about 50 seconds and then increased, and the fluctuation in water pressure of the hydrogen water was investigated. The result is depicted in FIG. 7.

Figure 6:
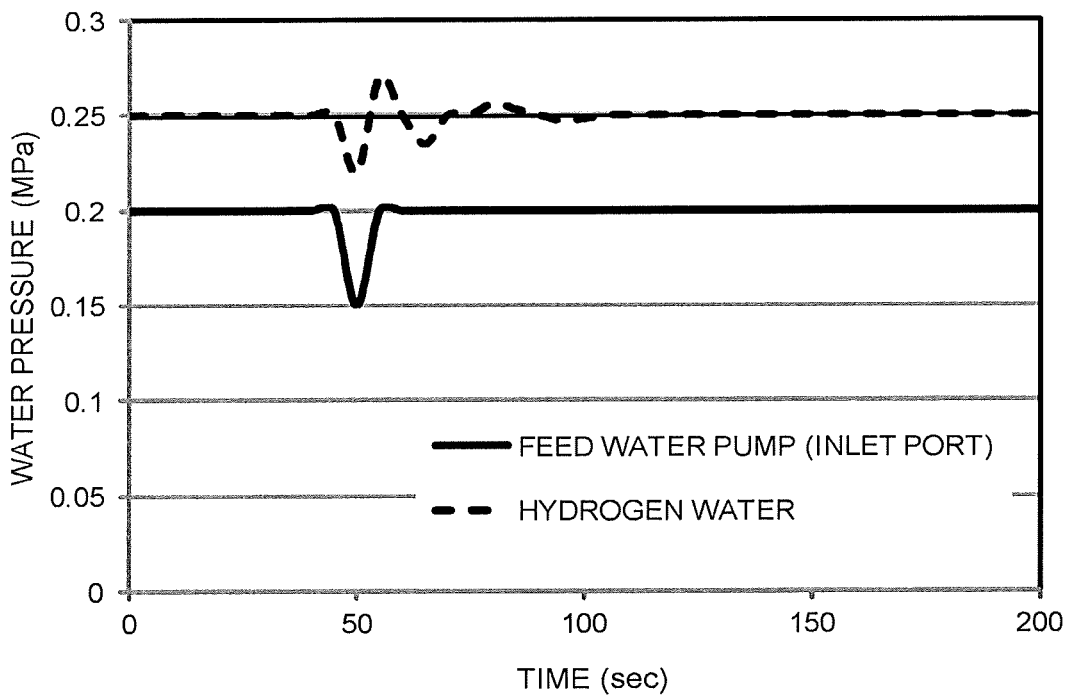
FIG. 6 is a graph depicting a water pressure fluctuation of hydrogen water flowing out of a dissolving device in a comparative example.
Figure 7:
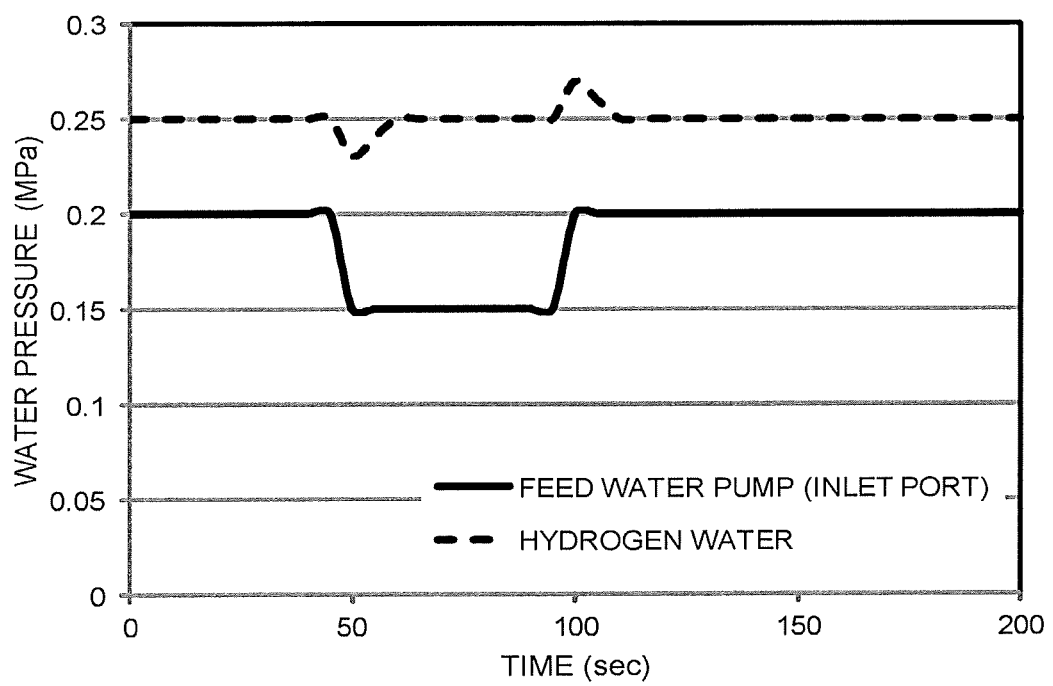
FIG. 7 is a graph depicting a water pressure fluctuation of hydrogen water flowing out of a dissolving device in a comparative example.

It is found from FIGS. 6, 7 that in the case of using no pressure reducing valve, the water pressure of the hydrogen water fluctuated when the feed water pressure to the feed water pump fluctuated.

Example 2

In the configuration in FIG. 1, the same pressure reducing valve and feed water pump as those in Example 1 were used in this order to feed ultrapure water into the same dissolving device as that in Example 1, and the dissolving device was used as in Example 1 to dissolve the hydrogen gas in the ultrapure water to produce hydrogen water. The water pressure of the hydrogen water was measured by a water pressure sensor, and the discharge pressure of the feed water pump was feedback-controlled with the measured value of the water pressure sensor so that the discharge pressure of the feed water pump became 0.25 MPa. The supply pressure of the ultrapure water to the pressure reducing valve was set to almost constant at 0.25 MPa, gradually decreased stepwise down to 0.19 MPa, and then increased back to 0.25 MPa. The water pressure of the ultrapure water on the outlet port of the pressure reducing valve (=the water pressure of the ultrapure water on the inlet port of the feed water pump) and the water pressure fluctuation of the hydrogen water flowing out of the dissolving device were investigated. The results are depicted in FIG. 8.

Figure 8:
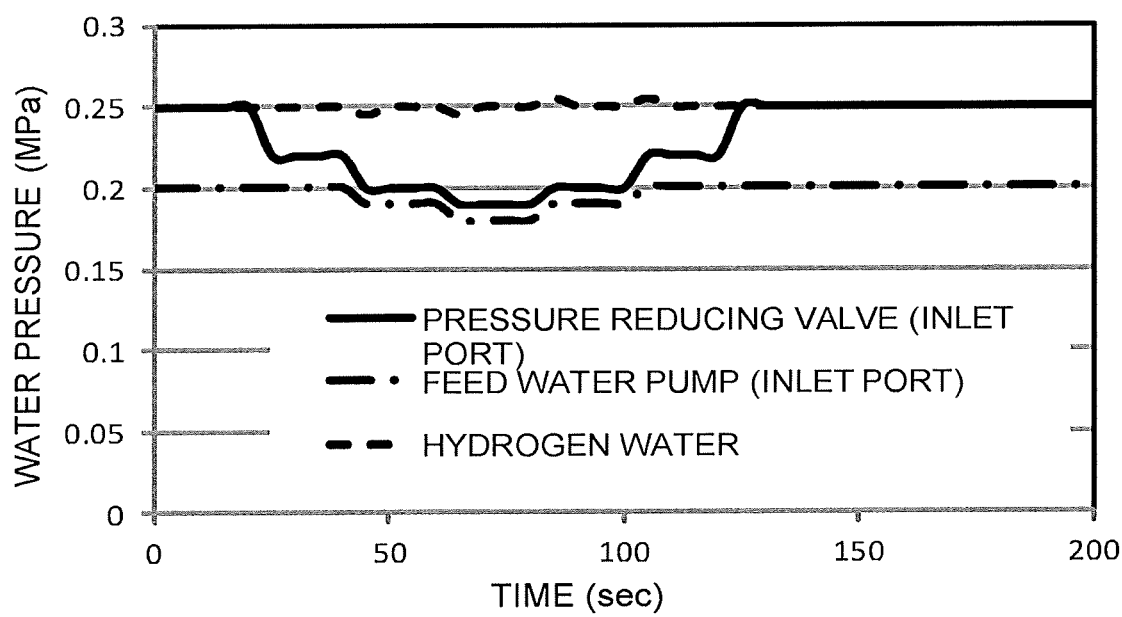
FIG. 8 is a graph depicting a water pressure fluctuation of hydrogen water flowing out of a dissolving device in another example.

As depicted in FIG. 8, it is found that when the supply pressure of the ultrapure water to the pressure reducing valve was 0.19 MPa, that is, lower than the set value of the outflow pressure of the pressure reducing valve, the water pressure of the hydrogen water was stably kept almost constant in a range of ±5% though there was minute fluctuation.

Example 3

In the configuration in FIG. 1, the same pressure reducing valve and feed water pump as those in Example 1 were used in this order to feed ultrapure water into the same dissolving device as that in Example 1, to thereby dissolve the hydrogen gas in the ultrapure water to produce hydrogen water as in Example 1. The water pressure of the hydrogen water was measured by a water pressure sensor, and the discharge pressure of the feed water pump was feedback-controlled with the measured value of the water pressure sensor so that the discharge pressure of the feed water pump became 0.25 MPa. The outflow pressure of the pressure reducing valve was set to 0.2 MPa. The supply pressure of the ultrapure water to the pressure reducing valve was set to almost constant at 0.25 MPa, gradually decreased stepwise down to 0.19 MPa, and then increased back to 0.25 MPa. The water pressure of the ultrapure water on the outlet port of the pressure reducing valve (=the water pressure of the ultrapure water on the inlet port of the feed water pump) and the water pressure fluctuation of the hydrogen water flowing out of the dissolving device were investigated. The results are depicted in FIG. 9.

Figure 9:
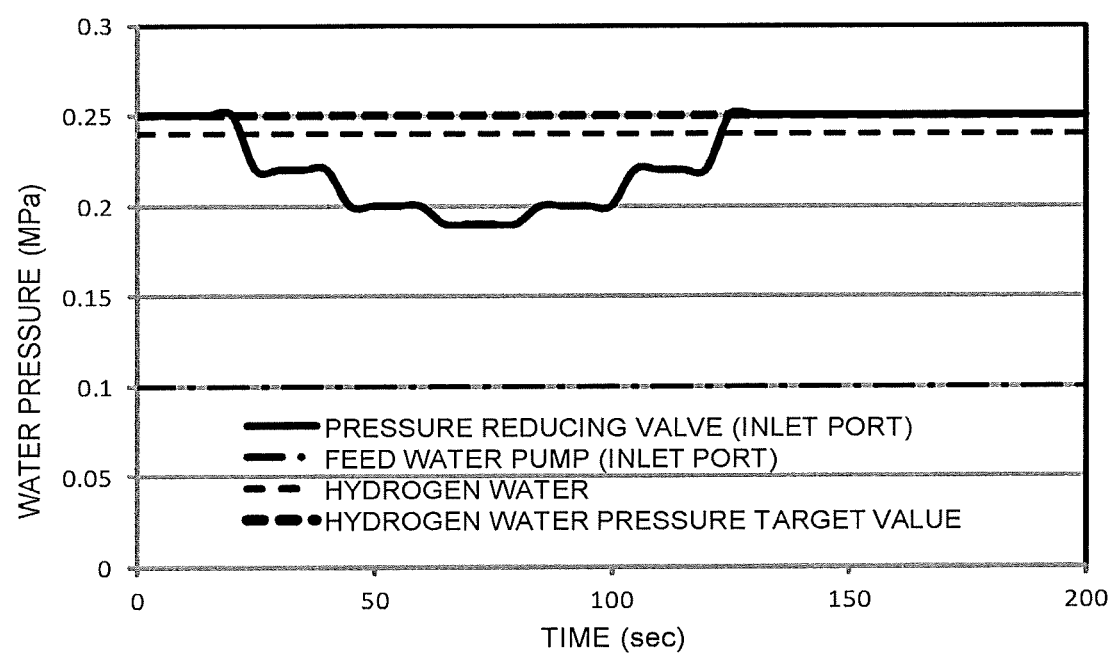
FIG. 9 is a graph depicting a water pressure fluctuation of hydrogen water flowing out of a dissolving device in another example.

As depicted in FIG. 9, it is found that the outflow pressure of the pressure reducing valve was 0.1 MPa, that is, lower by 150 kPa than the supply pressure of the ultrapure water, and therefore the water pressure of the hydrogen water did not reach 0.25 MPa being the target value, but the water pressure of the hydrogen water was stably kept constant.

In the pressure control of fluid, generally, only the pump is singly used when pressurizing fluid, and only the pressure reducing valve is singly used when reducing pressure, and both of them is not used in combination in usual. This is because the pressure of fluid is generally kept almost constant by either the pump or the pressure reducing valve singly. Here, the functional water needs to be constant in water pressure at the point of use, but in the dissolving device that dissolves the functional gas in the ultrapure water, when the ultrapure water is supplied by either the pump or the pressure reducing valve singly, the water pressure of the functional water flowing out of the dissolving device fluctuates due to the fluctuation of the pressure of the ultrapure water supplied by the ultrapure water producing apparatus which is the supply source of the ultrapure water.

In contrast, as illustrated in each example, the functional water producing apparatus in this embodiment, makes it possible to stabilize the supply water pressure of the ultrapure water to the dissolving device by using of the feed water pump and the pressure reducing valve in combination. Therefore, it is possible to stably keep the supply water pressure of the functional water. As described above, it has been confirmed that combining the two apparatuses offers a significant effect of stabilizing the pressure.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A functional water producing apparatus to produce functional water by using ultrapure water, the apparatus comprising:
    a water pressure regulator configured to produce a pressure-regulated ultrapure water by regulating a water pressure of the ultrapure water,
    the water pressure regulator having:
        a pressure reducing valve configured to depressurize the ultrapure water to an almost constant pressure; and
        a feed water pump configured to pressurize the ultrapure water depressurized by the pressure reducing valve;
    dissolving device configured to dissolve functional gas imparting a specific function in the pressure-regulated ultrapure water and
    a control device configured to control the feed water pump to pressurize the ultrapure water to a predetermined constant pressure based on a water pressure of the functional water or a flow rate of the functional water flowing out of the dissolving device.

2. The apparatus according to claim 1,
    wherein the water pressure of the ultrapure water flowing out of the pressure reducing valve is lower by 20 kPa to 200 kPa than the water pressure of the ultrapure water supplied to the pressure reducing valve.

3. The apparatus according to claim 1,
    wherein the water pressure of the ultrapure water supplied to the dissolving device is in a range from 235 kPa to 265 kPa.

4. The apparatus according to claim 1,
    wherein the feed water pump is a centrifugal volute pump.

5. The apparatus according to claim 1, further comprising:
    a water pressure sensor configured to measure the water pressure of the functional water flowing out of the dissolving device and output a measured value, wherein the control device controls the feed water pump based on the measured value so that the water pressure of the functional water is kept at the predetermined constant pressure.

6. The apparatus according to claim 1, wherein the functional gas is hydrogen gas.

* * * * *